(12) United States Patent
Kim et al.

(10) Patent No.: US 12,317,681 B2
(45) Date of Patent: May 27, 2025

(54) PIXEL AND DISPLAY DEVICE

(71) Applicant: Samsung Display Co., Ltd., Yongin-si (KR)

(72) Inventors: Hyunjoon Kim, Hwaseong-si (KR); Haemin Kim, Gumi-si (KR); Byungchang Yu, Seosan-si (KR); Minjae Jeong, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 457 days.

(21) Appl. No.: 17/701,089

(22) Filed: Mar. 22, 2022

(65) Prior Publication Data

US 2023/0013346 A1    Jan. 19, 2023

(30) Foreign Application Priority Data

Jul. 13, 2021    (KR) .................. 10-2021-0091769

(51) Int. Cl.
*G09G 3/3233* (2016.01)
*H10K 59/121* (2023.01)
*H10K 59/131* (2023.01)

(52) U.S. Cl.
CPC ....... *H10K 59/1213* (2023.02); *G09G 3/3233* (2013.01); *H10K 59/1216* (2023.02); *H10K 59/131* (2023.02)

(58) Field of Classification Search
CPC .................... G09G 3/3266; G09G 3/3233
See application file for complete search history.

(56) References Cited

U.S. PATENT DOCUMENTS

| | | | |
|---|---|---|---|
| 9,355,594 B2 | 5/2016 | Lee et al. | |
| 9,818,344 B2 | 11/2017 | Lin et al. | |
| 11,270,650 B2 | 3/2022 | Seo et al. | |
| 2020/0320933 A1 | 10/2020 | Zhou et al. | |
| 2021/0118368 A1* | 4/2021 | In .................. | G09G 3/3275 |
| 2021/0319755 A1 | 10/2021 | Kim et al. | |

FOREIGN PATENT DOCUMENTS

| | | |
|---|---|---|
| CN | 113971921 A | 1/2022 |
| EP | 3944226 A1 | 1/2022 |
| KR | 1020160024191 A | 3/2016 |
| KR | 102179312 B1 | 11/2020 |
| KR | 1020200142160 A | 12/2020 |
| KR | 1020210126177 A | 10/2021 |
| KR | 1020220014366 A | 2/2022 |

* cited by examiner

*Primary Examiner* — Kevin M Nguyen
(74) *Attorney, Agent, or Firm* — CANTOR COLBURN LLP

(57) ABSTRACT

A pixel of a display device includes a light emitting diode, a capacitor, and first to fourth transistors, where the first transistor is connected to the light emitting diode, and the second transistor is connected between the first transistor and a data line. A first electrode of the first transistor receives a data signal during a driving frame and a bias signal during a bias frame through the data line and the second transistor.

19 Claims, 10 Drawing Sheets

PIXEL AND DISPLAY DEVICE

This application claims priority to Korean Patent Application No. 10-2021-0091769, filed on Jul. 13, 2021, and all the benefits accruing therefrom under 35 U.S.C. § 119, the content of which in its entirety is herein incorporated by reference.

BACKGROUND

1. Field

The disclosure herein relates to a display device.

2. Description of the Related Art

Among display devices, an organic light-emitting display device displays an image using an organic light emitting diode that generates light by recombination of electrons and holes. Such an organic light emitting diode display has desired characteristics of having a fast response speed and being driven with low power consumption.

An organic light emitting display device may include pixels connected to data lines and scan lines. The pixels of the organic light emitting display device generally include an organic light emitting diode and a circuit unit for controlling an amount of current flowing through the organic light emitting diode. The circuit unit controls the amount of current flowing from a first driving voltage to a second driving voltage through an organic light emitting diode in response to a data signal, and light having a predetermined luminance is generated in response to the amount of current flowing through the organic light emitting diode.

SUMMARY

The disclosure provides a pixel and a display device capable of preventing degradation of display quality of an image even when a driving frequency thereof is changed.

An embodiment of the invention provides a pixel including: a first transistor including a first electrode, a second electrode, and a gate electrode electrically connected to a first voltage line which receives a first voltage; a first capacitor connected between a first node and the gate electrode of the first transistor; a light emitting diode including a first electrode electrically connected to the second electrode of the first transistor and a second electrode connected to a second voltage line which receives a second voltage; a second transistor including a first electrode connected to a data line, a second electrode electrically connected to the first electrode of the first transistor, and a gate electrode which receives a first scan signal; a third transistor including a first electrode electrically connected to the second electrode of the first transistor, a second electrode electrically connected to the gate electrode of the first transistor, and a gate electrode which receives a second scan signal; and a fourth transistor including a first electrode electrically connected to the first electrode of the first transistor, a second electrode electrically connected to the first node, and a gate electrode which receives a third scan signal, where the first electrode of the first transistor receives a data signal during a driving frame and receives a bias signal during a bias frame through the data line and the second transistor.

In an embodiment, each of the first to third scan signals may be activated in a predetermined order during the driving frame.

In an embodiment, during the bias frame, the first scan signal may be activated, and the second to third scan signals are maintained at inactive levels.

In an embodiment, the pixel may further include: a second capacitor electrically connected between the first voltage line and the first node; a fifth transistor including a first electrode electrically connected to the gate electrode of the first transistor, a second electrode electrically connected to a third voltage line which receives a third voltage, and a gate electrode which receives a fourth scan signal; a sixth transistor including a first electrode connected to the second electrode of the first transistor, a second electrode connected to the first electrode of the light emitting diode, and a gate electrode which receives a first emission control signal; a seventh transistor including a first electrode connected to the second electrode of the sixth transistor, a second electrode electrically connected to a fourth voltage line which receives a fourth voltage, and a gate electrode which receives a fifth scan signal; and an eighth transistor including a first electrode connected to the first voltage line, a second electrode connected to the first electrode of the first transistor, and a gate electrode which receives a second emission control signal.

In an embodiment, each of the first to fifth scan signals may be activated in a predetermined order during the driving frame, wherein during the bias frame, the second to fourth scan signals may be maintained at inactive levels, and the first scan signal and the fifth scan signal may be activated in a predetermined order.

In an embodiment, in each of the driving frame and the bias frame, the first emission control signal and the second emission control signal may be activated in a predetermined order.

In an embodiment, each of the first to eighth transistors may be a P-type transistor.

In an embodiment, the pixel may further include a ninth transistor including a first electrode connected to the gate electrode of the first transistor, a second electrode connected to the second electrode of the third transistor, and a gate electrode which receives the fourth scan signal.

In an embodiment, each of the first to fourth transistors and the sixth to eighth transistors may be a P-type transistor, and each of the fifth transistor and the ninth transistor may be an N-type transistor.

In an embodiment of the invention, a display device includes: a pixel connected to a plurality of scan lines and a data line; a scan driving circuit which outputs a plurality of scan signals for driving the pixel to the plurality of scan lines; a data driving circuit which outputs a data signal to the data line during a driving frame and output a bias signal to the data line during a bias frame; and a driving controller which controls the scan driving circuit and the data driving circuit, wherein the pixel emits light in response to the data signal received through the data line during the driving frame, and is initialized in response to the bias signal received through the data line during the bias frame.

In an embodiment, the driving controller may determine a driving frequency and controls the data driving circuit and the scan driving circuit to operate as the driving frame and the bias frame based on the driving frequency.

In an embodiment, the scan driving circuit may activate each of the plurality of scan signals in a predetermined order during the driving frame.

In an embodiment, the plurality of signals may include first to third scan signals, wherein the pixel may include: a first transistor including a first electrode, a second electrode, and a gate electrode electrically connected to a first voltage line which receives a first voltage; a first capacitor connected between a first node and the gate electrode of the first transistor; a light emitting diode including a first electrode electrically connected to the second electrode of the first transistor and a second electrode connected to a second voltage line which receives a second voltage; a second transistor including a first electrode connected to a data line, a second electrode electrically connected to the first electrode of the first transistor, and a gate electrode which receives the first scan signal; a third transistor including a first electrode electrically connected to the second electrode of the first transistor, a second electrode electrically connected to the gate electrode of the first transistor, and a gate electrode which receives the second scan signal; and a fourth transistor including a first electrode electrically connected to the first electrode of the first transistor, a second electrode electrically connected to the first node, and a gate electrode which receives the third scan signal, wherein the first electrode of the first transistor may receive the data signal during the driving frame and receive the bias signal during the bias frame through the data line and the second transistor.

In an embodiment, the scan driving circuit may maintain the second to fourth scan signals at an inactive level during the bias frame and activates the first scan signal.

In an embodiment, the display device may further include an emission driving circuit which outputs the first emission control signal and the second emission control signal, where the plurality of scan signals may further include a fourth scan signal and a fifth scan signal, where the pixel may include: a second capacitor electrically connected between the first voltage line and the first node; a fifth transistor including a first electrode electrically connected to the gate electrode of the first transistor, a second electrode electrically connected to a third voltage line which receives a third voltage, and a gate electrode which receives the fourth scan signal; a sixth transistor including a first electrode connected to the second electrode of the first transistor, a second electrode connected to the first electrode of the light emitting diode, and a gate electrode which receives the first emission control signal; a seventh transistor including a first electrode connected to the second electrode of the sixth transistor, a second electrode electrically connected to a fourth voltage line which receives a fourth voltage, and a gate electrode which receives the fifth scan signal; and an eighth transistor including a first electrode connected to the first voltage line, a second electrode connected to the first electrode of the first transistor, and a gate electrode which receives a second emission control signal.

In an embodiment, the scan driving circuit may activate each of the first to fifth scan signals in a predetermined order during the driving frame, wherein the scan driving circuit may maintain the second to fourth scan signals at inactive levels during the bias frame and activate the first scan signal and the fifth scan signal in a predetermined order, respectively.

In an embodiment, each of the first to eighth transistors may be a P-type transistor.

In an embodiment, the display device may further include a ninth transistor including a first electrode connected to the gate electrode of the first transistor, a second electrode connected to the second electrode of the third transistor, and a gate electrode which receives the fourth scan signal.

In an embodiment, each of the first to fourth transistors and the sixth to eighth transistors may be a P-type transistor, and each of the fifth transistor and the ninth transistor may be an N-type transistor.

In an embodiment, the driving controller may determine the driving frequency as one selected from a first frequency and a second frequency lower than the first frequency, where when the driving controller determines the driving frequency is the first frequency, one frame may include only the driving frame, where when the driving controller determines the driving frequency is the second frequency, one frame may include the driving frame and the bias frame.

BRIEF DESCRIPTION OF THE FIGURES

The above and other features of the invention will become more apparent by describing in further detail embodiments thereof with reference to the accompanying drawings, in which.

DETAILED DESCRIPTION

Figure 1:
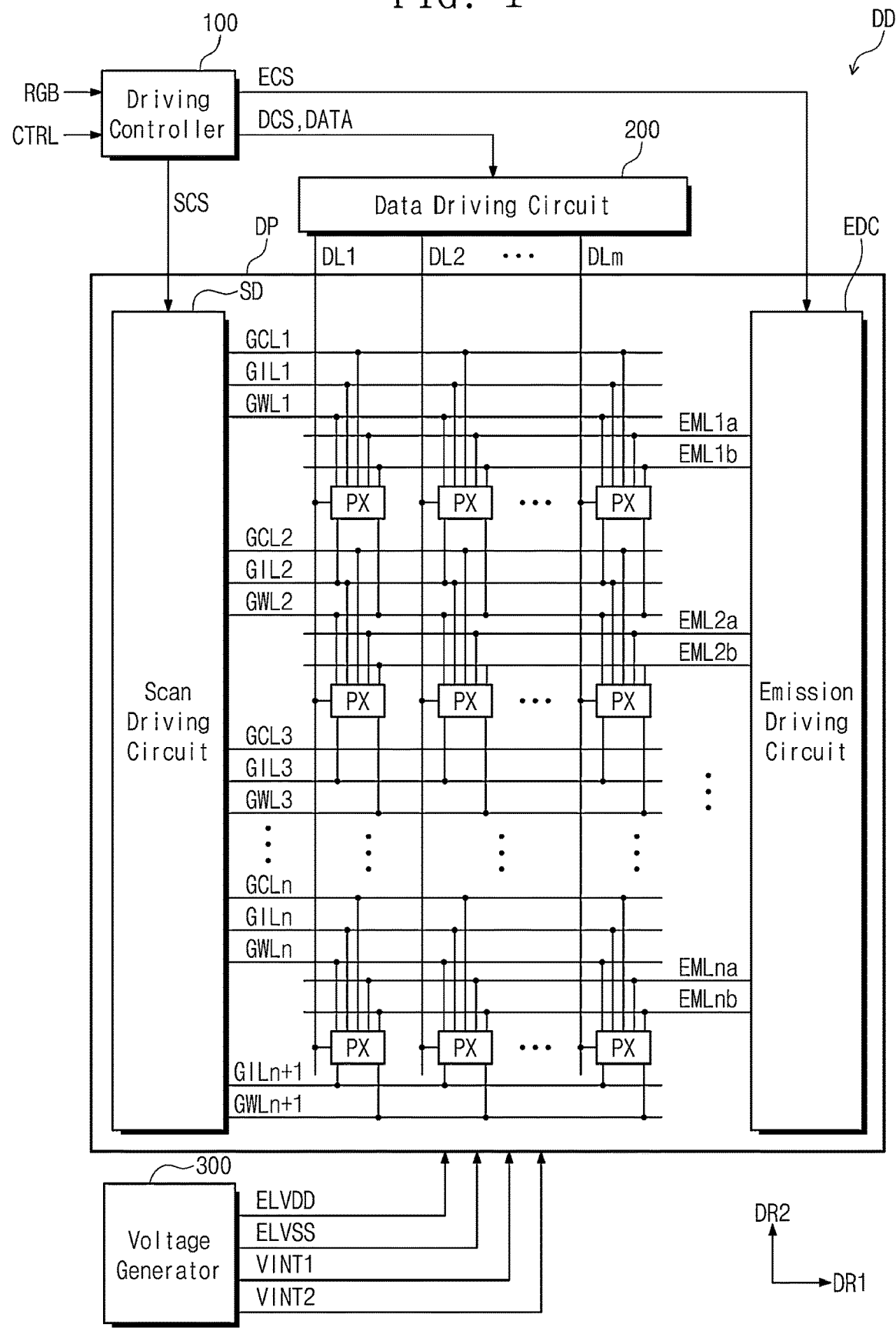
FIG. 1 is a block diagram of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements throughout. Additionally, in the drawings, the thicknesses, proportions, and dimensions of components are exaggerated for effective description.

It will be understood that the terms "first" and "second" are used herein to describe various components but these components should not be limited by these terms. The above terms are used only to distinguish one component from another. For example, a first component may be referred to as a second component and vice versa without departing from the scope of the invention. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. In addition, terms such as terms defined in commonly used dictionaries should be interpreted as having a meaning consistent with the meaning in the context of the related technology, and it should not be construed in an overly ideal or overly formal sense unless explicitly defined here.

Hereinafter, embodiments of the invention will be described in detail with reference to the accompanying drawings.

FIG. 1 is a block diagram of a display device according to an embodiment of the invention.

Referring to FIG. 1, an embodiment of a display device DD includes a display panel DP, a driving controller 100, a data driving circuit 200, and a voltage generator 300.

The driving controller 100 receives an image signal RGB and a control signal CTRL from an outside or an external device. The driving controller 100 generates an image data signal DATA obtained by converting a data format of the image signal RGB to meet the specification of an interface with the data driving circuit 200. The driving controller 100 outputs a scan control signal SCS, a data control signal DCS, and an emission driving signal ECS.

The data driving circuit 200 receives a data control signal DCS and an image data signal DATA from the driving controller 100. The data driving circuit 200 converts the image data signal DATA into data signals, and outputs the data signals to a plurality of data lines DL1 to DLm, which will be described later. The data signals are analog voltages corresponding to the grayscale value of the image data signal DATA.

The voltage generator 300 generates voltages used for the operation of the display panel DP. In an embodiment, the voltage generator 300 generates a first driving voltage ELVDD (or a first voltage), a second driving voltage ELVSS (or a second voltage), a first initialization voltage VINT1 (or a third voltage), and a second initialization voltage VINT2 (or a fourth voltage).

The display panel DP includes scan lines GCL1 to GCLn, GIL1 to GILn+1, and GWL1 to GWLn+1, emission control lines EML1a to EMLna, and EML1b to EMLnb, data lines DL1 to DLm, and pixels PX. The display panel DP may further include a scan driving circuit SD and an emission driving circuit EDC. In an embodiment, the scan driving circuit SD is arranged or disposed on the first side of the display panel DP. The scan lines GCL1 to GCLn, GIL1 to GILn+1, and GWL1 to GWLn+1 extend in the first direction DR1 from the scan driving circuit SD.

The emission driving circuit EDC is arranged on the second side of the display panel DP. The emission control lines EML1a to EMLna and EML1b to EMLnb extend in a direction opposite to the first direction DR1 from the emission driving circuit EDC.

The scan lines GCL1 to GCLn, GIL1 to GILn+1, and GWL1 to GWLn+1 and the emission control lines EML1a to EMLna and EML1b to EMLnb are arranged to be spaced apart from each other in the second direction DR2. The data lines DL1 to DLm extend in a direction opposite to the second direction DR2 from the data driving circuit 200 and are arranged to be spaced apart from each other in the first direction DR1.

In an embodiment, as shown in FIG. 1, the scan driving circuit SD and the emission driving circuit EDC are arranged facing each other with pixels PX interposed therebetween, but the invention is not limited thereto. In an alternative embodiment, for example, the scan driving circuit SD and the emission driving circuit EDC may be disposed adjacent to each other on one of the first side and the second side of the display panel DP. In an embodiment, the scan driving circuit SD and the emission driving circuit EDC may be configured as a single circuit.

The plurality of pixels PX are electrically connected to the scan lines GCL1 to GCLn, GIL1 to GILn+1, and GWL1 to GWLn+1, the emission control lines EML1a to EMLna, and EML1b to EMLnb, and the data lines DL1 to DLm, respectively. Each of the plurality of pixels PX may be electrically connected to five scan lines and two emission control lines. In an embodiment, for example, as shown in FIG. 1, the pixels in the first row may be connected to the scan lines GCL1, GIL1, GIL2, GWL1, and GWL2 and the emission control lines EML1a and EML1b. Also, the pixels in the second row may be connected to the scan lines GCL2, GIL2, GIL3, GWL2, and GWL3 and the emission control lines EML2a and EML2b.

Each of the plurality of pixels PX includes a light emitting diode ED (refer to FIG. 2) and a pixel circuit unit PXC (refer to FIG. 2) that controls emission of the light emitting diode ED. The pixel circuit unit PXC may include at least one transistor and at least one capacitor. The scan driving circuit SD and the emission driving circuit EDC may include transistors formed through a same process as the pixel circuit unit PXC.

Each of the plurality of pixels PX receives a first driving voltage ELVDD, a second driving voltage ELVSS, a first initialization voltage VINT1, and a second initialization voltage VINT2 from the voltage generator 300.

The scan driving circuit SD receives the scan control signal SCS from the driving controller 100. The scan driving circuit SD outputs scan signals GC1 to GCn, GI1 to GIn+1, and GW1 to GWn+1 to the scan lines GCL1 to GCLn, GIL1 to GILn+1, and GWL1 to GWLn+1 in response to the scan control signal SCS.

The emission driving circuit EDC may output the emission control signals EM1a to EMna and EM1b to EMnb to the emission control lines EML1a to EMLna and EML1b to EMLnb in response to an emission driving signal ECS from the driving controller 100.

An embodiment of the driving controller 100 according to the invention may determine the driving frequency, and control the data driving circuit 200, the scan driving circuit SD, and the emission driving circuit EDC based on the determined driving frequency.

Figure 2:
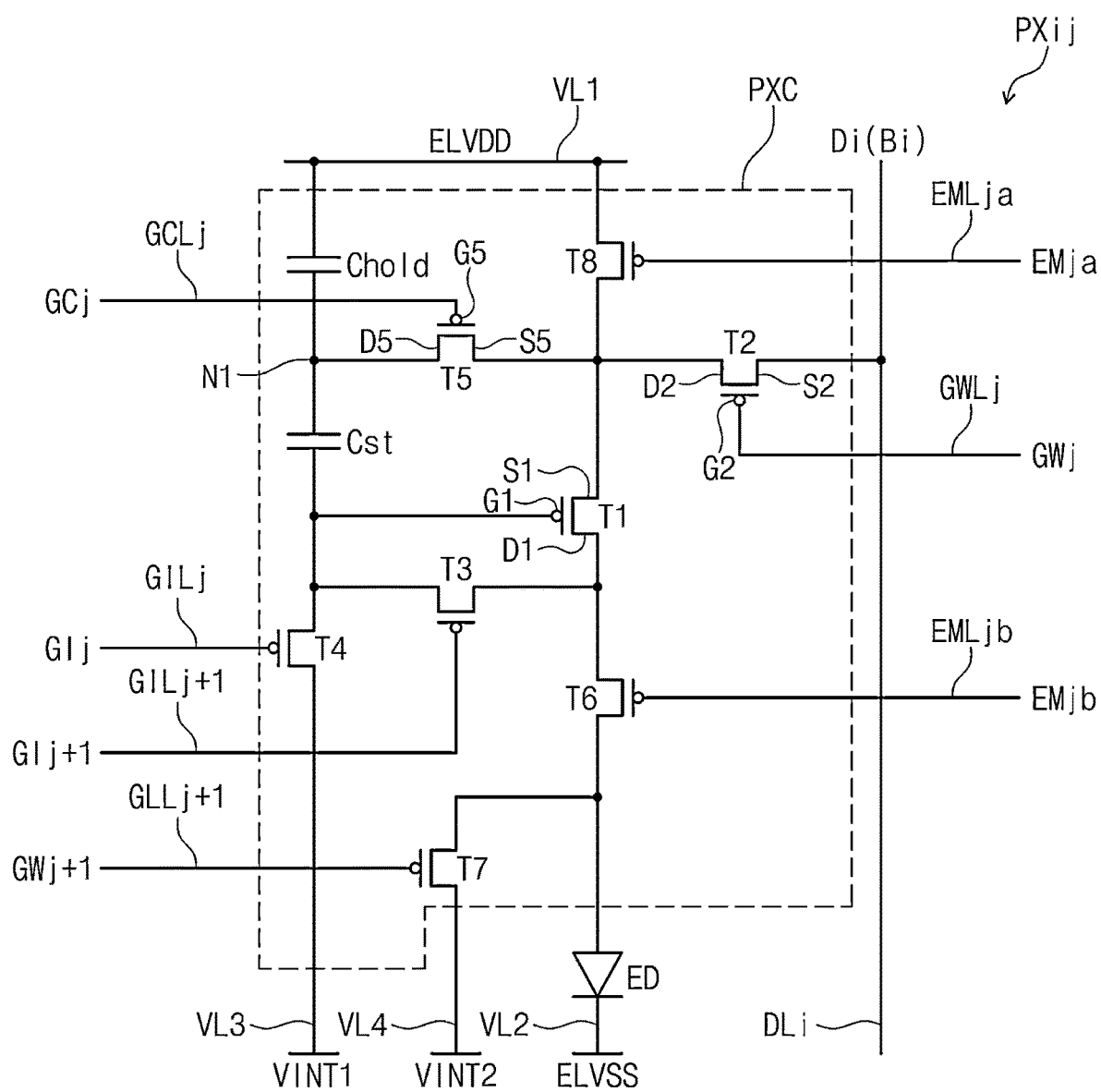
FIG. 2 is an equivalent circuit diagram of a pixel according to an embodiment of the invention.

FIG. 2 is an equivalent circuit diagram of a pixel according to an embodiment of the invention.

Figure 3:
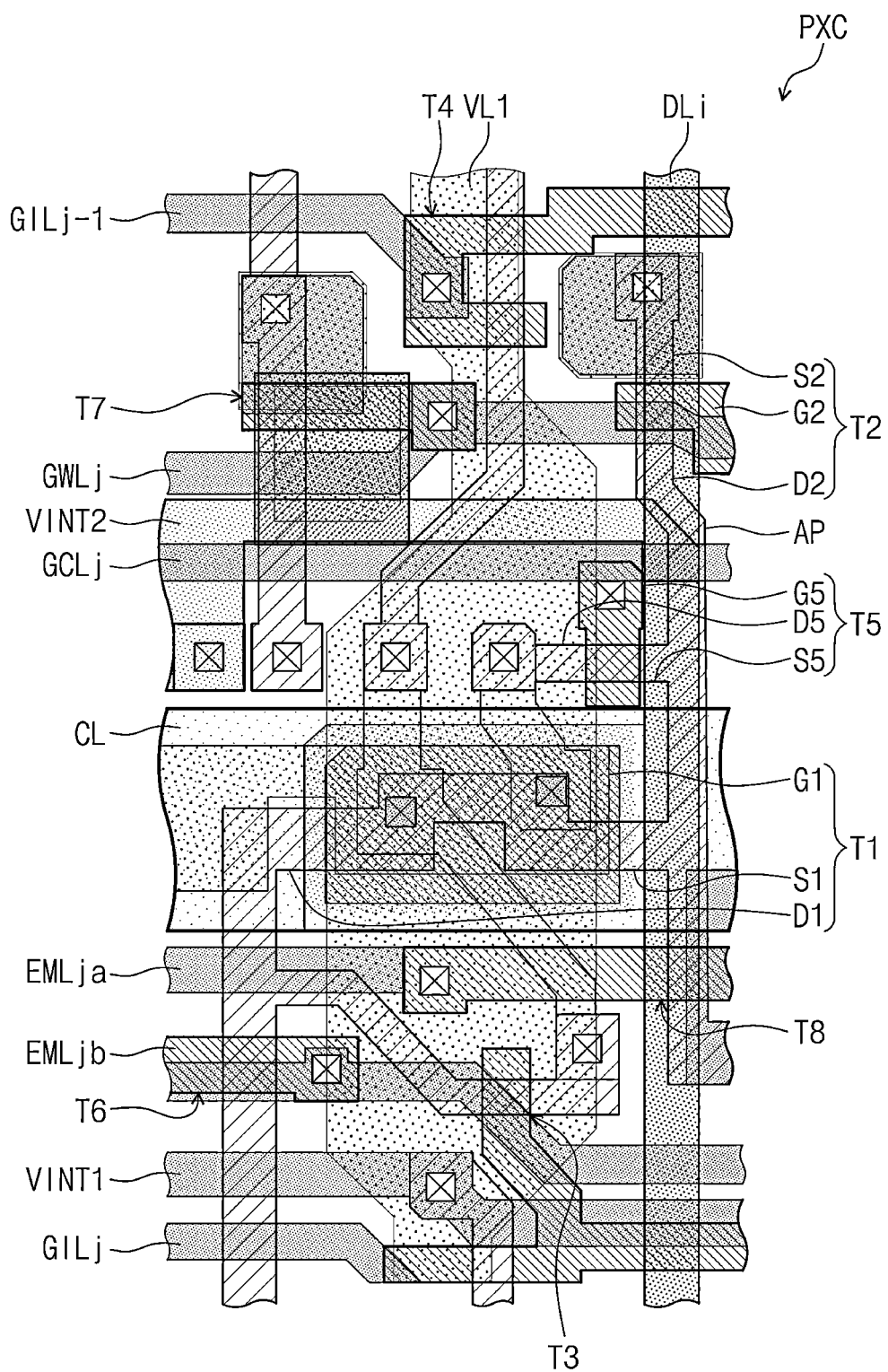
FIG. 3 is a plan view of an embodiment of the pixel circuit unit shown in FIG. 2.

FIG. 3 is a plan view of an embodiment of the pixel circuit unit shown in FIG. 2.

FIG. 2 shows an equivalent circuit diagram of an embodiment of a pixel PXij connected to an i-th data line DLi among the data lines DL1 to DLm, a j-th scan lines GILj, GCLj, and GWLj and the (j+1)-th scan lines GILJ+1 and GWLj+1 among the scan lines GCL1 to GCLn, GIL1 to GILn+1, and GWL1 to GWLn+1, and j-th emission control lines EMLja and EMLjb among the emission control lines EML1a to EMLna and EML1b to EMLnb, which are shown in FIG. 1.

Each of the plurality of pixels PX illustrated in FIG. 1 may have a same circuit configuration as the equivalent circuit diagram of the pixel PXij illustrated in FIG. 2.

Referring to FIG. 2, an embodiment of a pixel PXij of a display device includes a pixel circuit unit PXC and at least one light emitting diode ED. In an embodiment, each pixel PXij may include a single light emitting diode ED as shown in FIG. 2.

The pixel circuit unit PXC includes first to eighth transistors T1, T2, T3, T4, T5, T6, T7, and T8 and capacitors Cst and Chold. FIG. 2 shows only one embodiment of the pixel circuit unit PXC, and the configuration of the pixel circuit unit PXC may be variously modified and implemented.

In an embodiment, each of the first to eighth transistors T1 to T8 is a P-type transistor having a low-temperature polycrystalline silicon ("LTPS") semiconductor layer. In an alternative embodiment, at least one of the first to eighth transistors T1 to T8 may be an N-type transistor using an oxide semiconductor as a semiconductor layer, and the others of the first to eighth transistors T1 to T8 may be a P-type transistor. In another alternative embodiment, all of the first to eighth transistors T1 to T8 may be N-type transistors.

The scan lines GCLj, GILj, GILj+1, GWLj, and GWLj+1 may transmit scan signals GCj, GIj, GIj+1, GWj, GWj+1, respectively, and the emission control lines EMLja and EMLjb may transmit the emission control signals EMja and EMjb. The data line DLi transmits any one of the data signal Di and the bias signal Bi. The data signal Di may have a voltage level corresponding to the image signal RGB inputted to the display device DD (refer to FIG. 1). The first to fourth driving voltage lines VL1, VL2, VL3, and VL4 may transmit a first driving voltage ELVDD, a second driving voltage ELVSS, a first initialization voltage VINT1, and a second initialization voltage VINT2. The bias signal Bi transmitted through the data line DLi may be a signal having a predetermined voltage level (e.g., a voltage level between 3 V and 7 V). The bias signal Bi transmitted through the data line DLi will be described in detail later.

The first transistor T1 includes a first electrode S1 electrically connected to the first driving voltage line VL1 via the eighth transistor T8, a second electrode D1 electrically connected to the anode of the light emitting diode ED via the sixth transistor T6, and a gate electrode G1 connected to the first node N1. The first transistor T1 may receive the data signal Di through the data line DLi based on the switching operation of the second transistor T2 to supply a driving current to the light emitting diode ED.

The second transistor T2 includes a first electrode S2 connected to the data line DLi, a second electrode D2 connected to the first electrode S1 of the first transistor T1, and a gate electrode G2 connected to the scan line GWLj. The second transistor T2 is turned on in response to the scan signal GWj received through the scan line GWLj to transmit the data signal Di from the data line DLi to the first electrode of the first transistor T1.

The third transistor T3 includes a first electrode connected to the second electrode D1 of the first transistor T1, a second electrode connected to the gate electrode G1 of the first transistor T1, and a gate electrode connected to the scan line GILj+1. The third transistor T3 is turned on in response to the scan signal GIj+1 received through the scan line GILj+1 to diode-connect the first transistor T1 by electrically connecting the second electrode Di of the first transistor T1 and the gate electrode G1 of the first transistor T1 to each other.

The fourth transistor T4 includes a first electrode connected to the gate electrode of the first transistor T1, a second electrode connected to the third driving voltage line VL3 to which the first initialization voltage VINT1 is transmitted, and a gate electrode connected to the scan line GILj. The fourth transistor T4 is turned on in response to the scan signal GIj received through the scan line GILj to transmit the first initialization voltage VINT1 to the gate electrode of the first transistor T1. The first initialization voltage VINT1 may be a voltage for initializing the gate electrode of the first transistor T1.

The fifth transistor T5 includes a first electrode S5 connected to the first electrode of the first transistor T1, a second electrode D5 connected to the first node N1, and a gate electrode G5 connected to the scan line GCLj. The fifth transistor T5 is turned on in response to the scan signal GCj received through the scan line GCLj to electrically connect the first electrode S1 of the first transistor T1 and the first node N1.

The sixth transistor T6 includes a first electrode connected to the second electrode D1 of the first transistor T1, a second electrode connected to the anode of the light emitting diode ED, and a gate electrode connected to the emission control line EMLjb.

The seventh transistor T7 includes a first electrode connected to the second electrode of the sixth transistor T6, a second electrode connected to the fourth driving voltage line VL4, and a gate electrode connected to the scan line GWLj+1. The seventh transistor T7 is turned on in response to the scan signal GWj+1 transmitted through the scan line GWLj+1, and bypasses the current of the anode of the light emitting diode ED to the fourth driving voltage line VL4.

The eighth transistor T8 includes a first electrode connected to the first driving voltage line VL1, a second electrode connected to the first electrode of the first transistor T1, and a gate electrode connected to the emission control line EMLja.

In an embodiment, as shown in FIGS. 2 and 3, the first electrode S1 of the first transistor T1, the second electrode D2 of the second transistor T2, and the first electrode S5 of the fifth transistor T5 may be electrically connected to each other, and the first electrode S1 of the first transistor T1, the second electrode D2 of the second transistor T2, and the first electrode S5 of the fifth transistor T5 may be defined or formed by a same active pattern.

The capacitor Chold is connected between the first driving voltage line VL1 and the first node N1. In an embodiment, as shown in FIG. 3, the capacitor Chold may be defined or formed by the first driving voltage line VL1 and the conductive layer CL.

The capacitor Cst is connected between the first node N1 and the gate electrode G1 of the transistor T1. In an embodiment, as shown in FIG. 3, the capacitor Cst may be defined or formed by the conductive layer CL and the gate electrode G1 of the transistor T1. The conductive layer CL may be electrically connected to the second electrode D5 of the fifth transistor T5.

FIG. 3 shows scan lines GILj-1 and GILj. The scan lines GILj and GILj+1 shown in FIG. 2 may be disposed in a same manner as the scan lines GILj-1 and GILj.

In FIG. 3, withdrawal symbols for the first electrode, the second electrode, and the gate electrode of each of the third, fourth, sixth, seventh, and eighth transistors T3, T4, T6, T7, and T8 are not denoted. Withdrawal symbols T3, T4, T6, T7, and T8 indicate the gate electrodes of the third, fourth, sixth, seventh and eighth transistors T3, T4, T6, T7, and T8, respectively. The first and second electrodes of the third, fourth, sixth, seventh, and eighth transistors T3, T4, T6, T7, and T8 may be defined or formed by the active pattern AP.

In embodiments of the invention, the structure and layout of the pixel PXij is not limited to those shown in FIGS. 2 and 3, and in addition, the number of the transistors and the number of the capacitors included in one pixel PXij, and a connection relationship thereof may be variously modified.

Figure 4A:
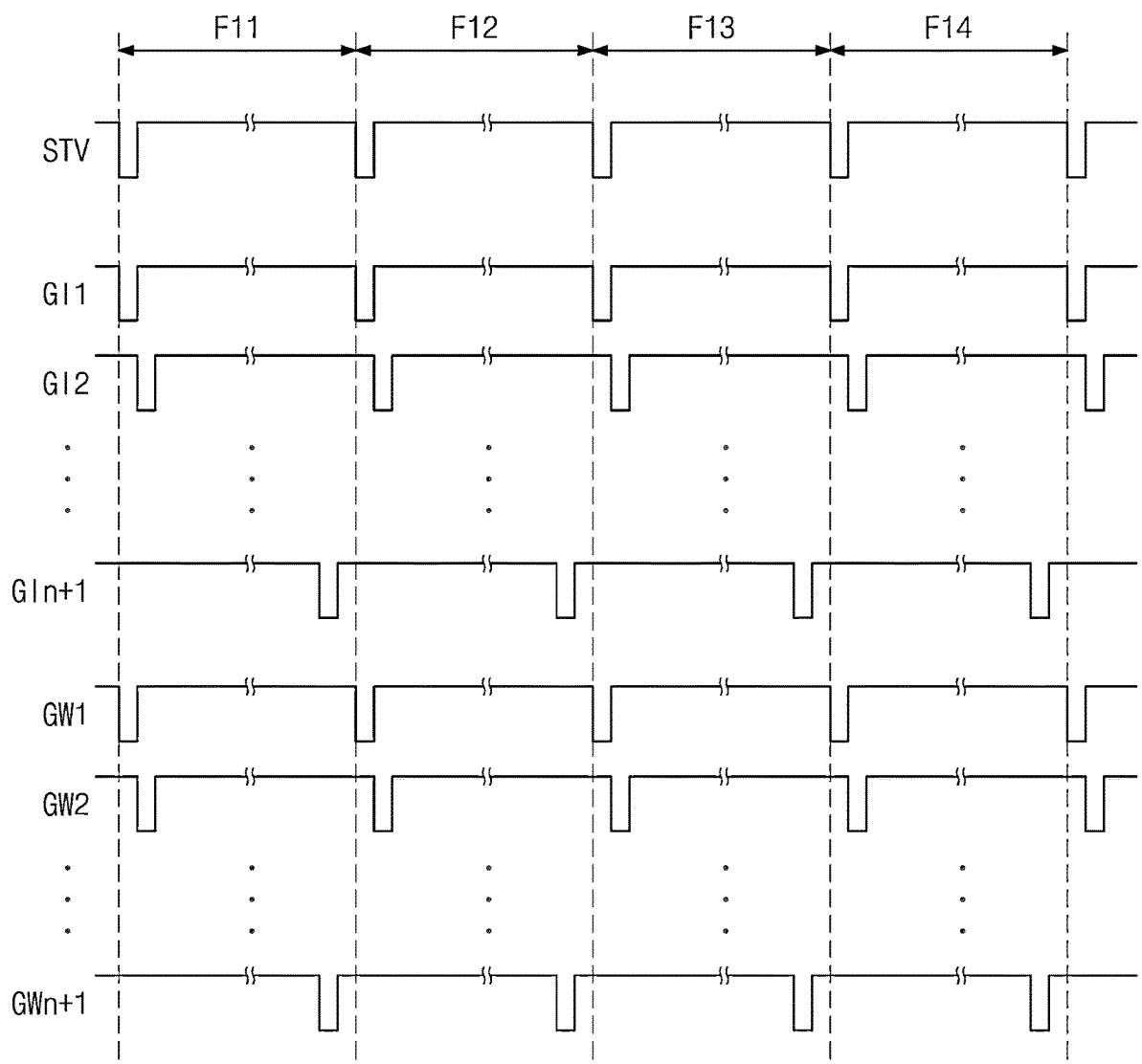
FIGS. 4A, 4B, and 4C are timing diagrams showing an operation of the display device according to an embodiment of the invention.
Figure 4B:
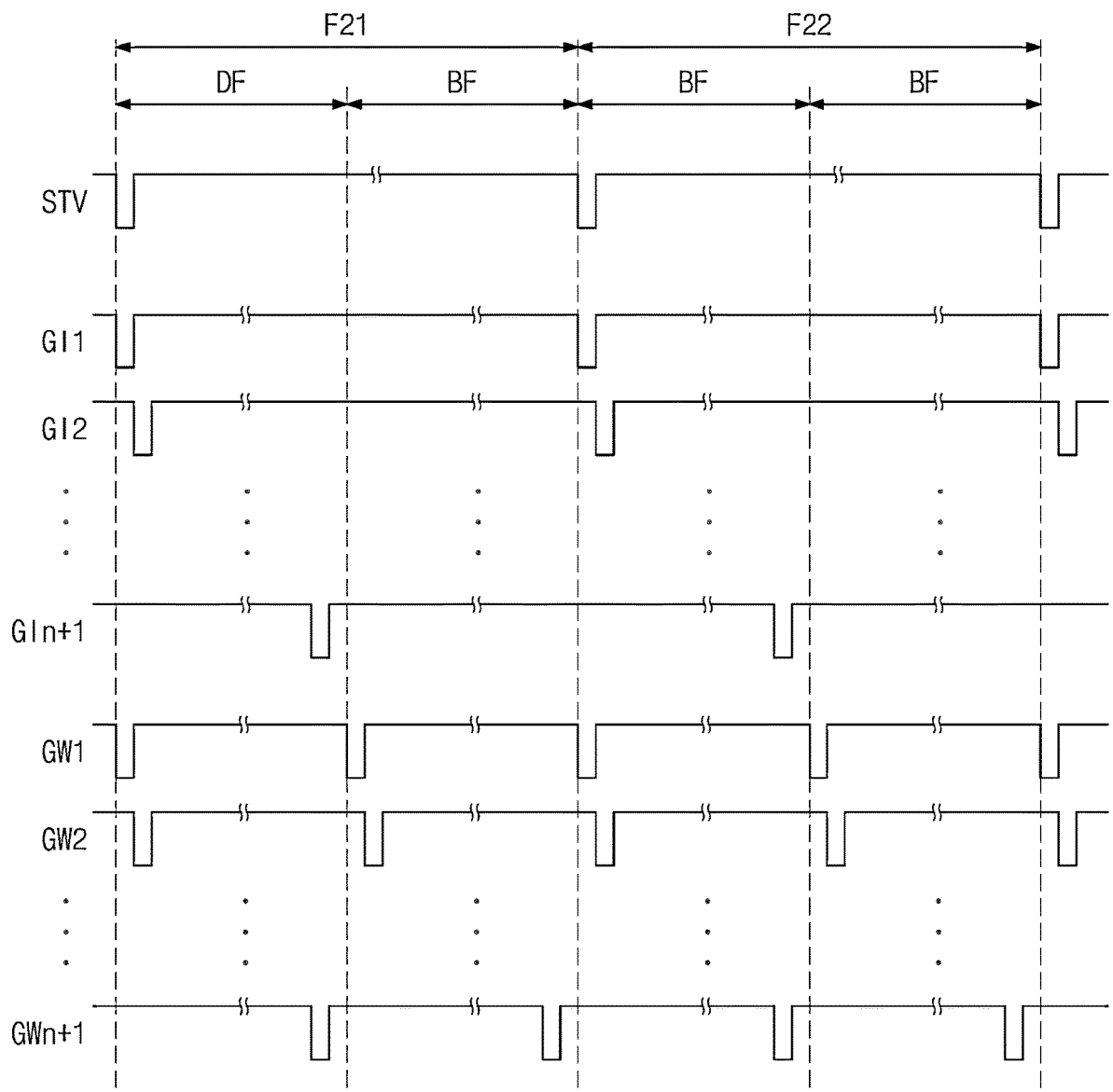
Figure 4C:
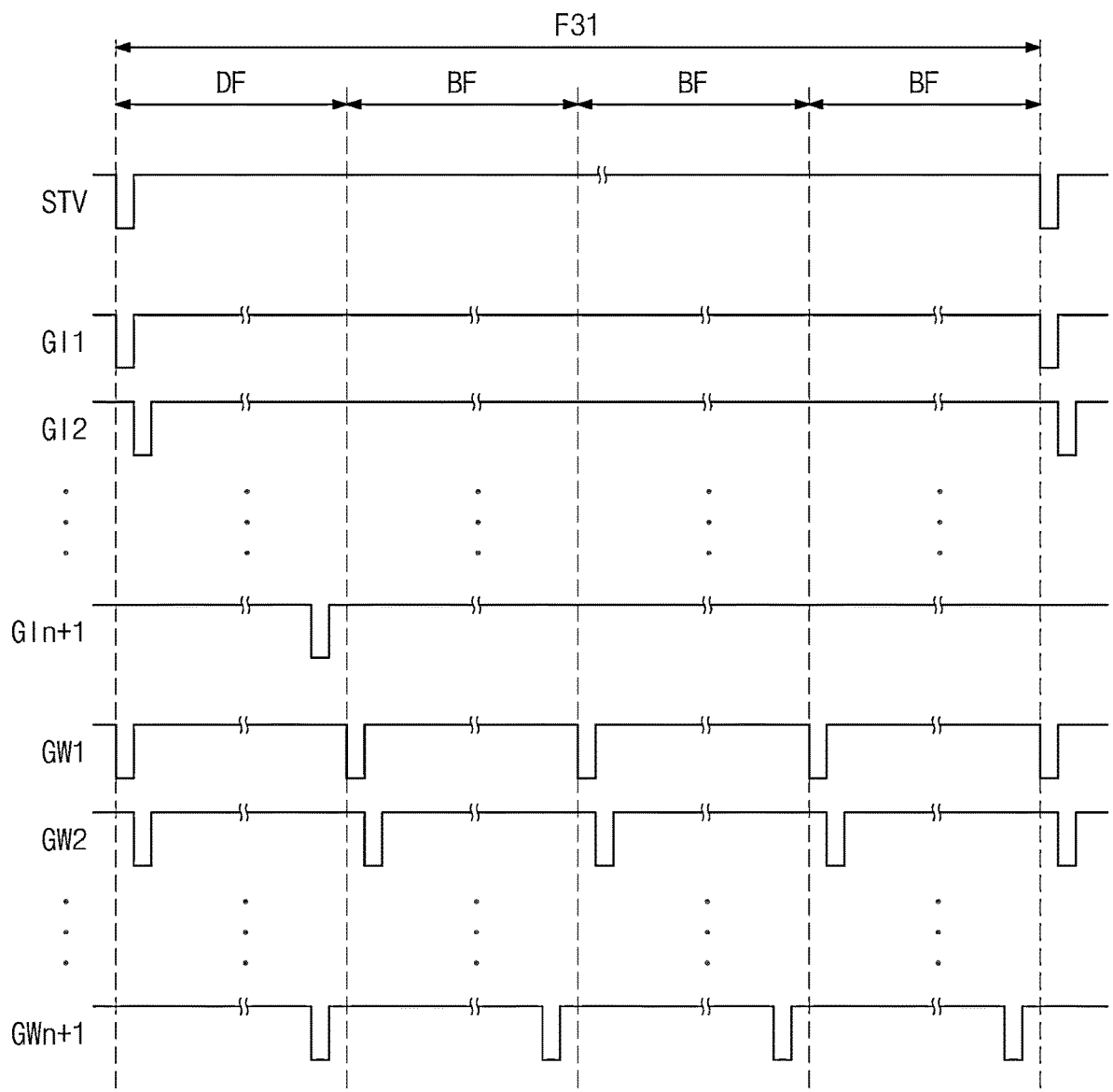

FIGS. 4A, 4B, and 4C are signal timing diagrams showing an operation of the display device according to an embodiment of the invention.

Referring to FIGS. 1, 4A, 4B, and 4C, in an embodiment, the driving frequency of the display device DD may be variously changed during an operation thereof. For convenience of description, embodiments where the display device DD operates at a first frequency (e.g., 240 Hz), a second frequency (e.g., 120 Hz) or a third frequency (e.g., 60 Hz) will hereinafter be described in detail, but the invention is not limited thereto. In an embodiment, the driving frequency of the display device DD may be selected from the first frequency, the second frequency, and the third frequency based on the type of the image signal RGB. In an embodiment, for example, when the image signal RGB is a moving image, the driving frequency of the display device DD may be selected as the first frequency. In an embodiment, for example, when the image signal RGB is an image having a long change period, the driving frequency of the display device DD may be selected as the second frequency. In an embodiment, for example, when the image signal RGB is an image that does not change for a long time, such as a digital picture frame, the driving frequency of the display device DD may be selected as the third frequency.

The driving controller 100 provides the scan control signal SCS to the scan driving circuit SD. The scan control signal SCS may include a start signal STV indicating the start of one frame.

FIG. 4A is a signal timing diagram of a start signal STV and scan signals when the driving frequency of the display device DD is a first frequency (e.g., 240 Hz).

Referring to FIGS. 1 and 4A, when the driving frequency is the first frequency (e.g., 240 Hz), the start signal STV is activated at a low level at the beginning of each of the frames F11, F12, F13, and F14. The scan driving circuit SD sequentially activates the scan signals GI1 to GIn+1 and the scan signals GW1 to GWn+1 to a low level in each of the frames F11, F12, F13, and F14 in response to the start signal STV. Although only the scan signals GI1 to GIn+1 and the scan signals GW1 to GWn+1 are shown in FIG. 4A for convenience of illustration, the scan signals GC1 to GCn and the emission control signals EM1a to EMna and EM1b to EMnb may also be sequentially activated to a low level in each of the frames F11, F12, F13, and F14.

FIG. 4B is a signal timing diagram of a start signal STV and scan signals when the driving frequency of the display device DD is a second frequency (e.g., 120 Hz).

Referring to FIGS. 1 and 4B, when the driving frequency is the second frequency (e.g., 120 Hz), the start signal STV is activated at a low level at the beginning of each of the frames F21 and F22. The duration of each of the frames F21 and F22 may be twice the duration of each of the frames F11, F12, F13, and F14 illustrated in FIG. 4A.

Each of the frames F21 and F22 may include one driving frame DF and one bias frame BF. The scan driving circuit SD sequentially activate the scan signals GI1 to GIn+1, the scan signals GC1 to GCn+1, the scan signals GW1 to GWn+1, and the emission control signals EM1a to EMna and EM1b to EMnb to a low level in a predetermined order during the driving frame DF.

Although only the scan signals GI1 to GIn+1 and the scan signals GW1 to GWn+1 are shown in FIG. 4B for convenience of illustration, the scan signals GC1 to GCn and the emission control signals EM1a to EMna and EM1b to EMnb may also be sequentially activated to a low level during the driving frame DF.

The scan driving circuit SD maintains the scan signals GI1 to GIn+1 controlling the third and fourth transistors T3 and T4 that affect the voltage level of the gate electrode of the first transistor T1 in a high level inactive state during the bias frame BF. In addition, the scan driving circuit SD sequentially activates only the scan signals GW1 to GWn+1 to a low level during the bias frame BF to initialize the source electrode of the first transistor T1 and the anode of the light emitting diode ED. Among the scan signals, the bias frame BF may be referred to as a self-scan frame.

Although not shown in FIG. 4B, the scan signals GC1 to GCn may also be maintained in an inactive state of a high level during the bias frame BF.

In the example shown in FIG. 4A, each of the frames F11, F12, F13, and F14 may correspond to the driving frame DF shown in FIG. 4B.

FIG. 4C is a signal timing diagram of a start signal STV and scan signals when the driving frequency of the display device DD is a third frequency (e.g., 60 Hz).

Referring to FIGS. 1 and 4C, when the driving frequency is the third frequency (e.g., 60 Hz), the start signal STV is activated at a low level at the beginning of the frame F31. The duration of the frame F31 may be twice the duration of each of the frames F21 and F22 illustrated in FIG. 4B. The duration of the frame F31 may be four times the duration of each of the frames F11, F12, F13, and F14 illustrated in FIG. 4A.

The frame F31 may include one driving frame DF and three bias frames BF. The scan driving circuit SD sequentially activates the scan signals GI1 to GIn+1 and the scan signals GW1 to GWn+1 to a low level during the driving frame DF.

Although only the scan signals GI1 to GIn+1 and the scan signals GW1 to GWn+1 are shown in FIG. 4C for convenience of illustration, the scan signals GC1 to GCn and the emission control signals EM1a to EMna and EM1b to EMnb may also be sequentially activated to a low level during the driving frame DF.

The scan driving circuit SD maintains the scan signals GI1 to GIn+1 in each of the three bias frames BF in an inactive state of a high level, and sequentially activates only the scan signals GW1 to GWn+1 to a low level.

Although not shown in FIG. 4C, the scan signals GC1 to GCn may also be maintained in an inactive state of a high level in each of the bias frames BF.

Figure 5:
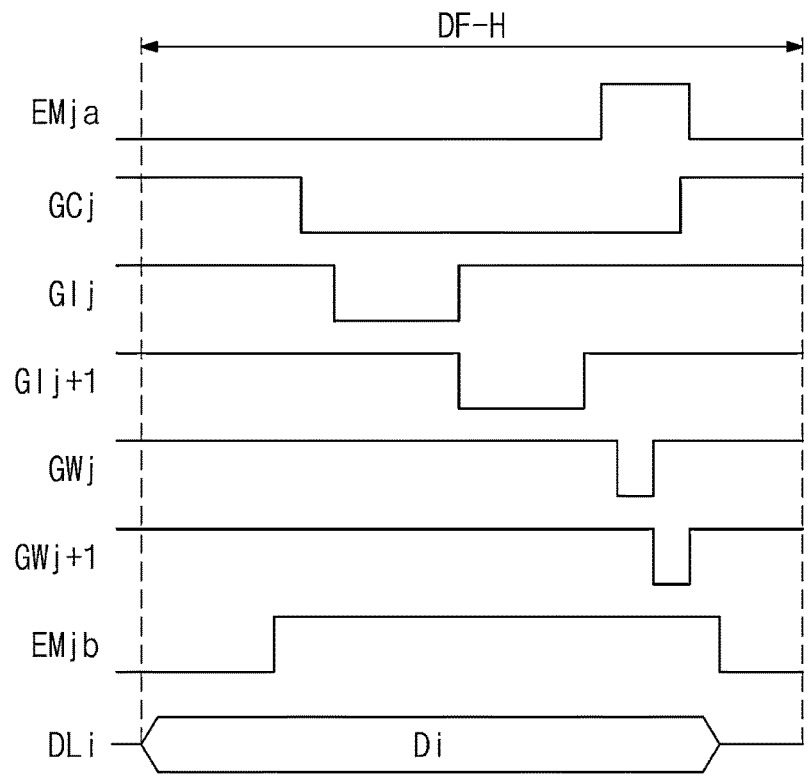
FIG. 5 is a signal timing diagram of scan signals and emission control signals during a horizontal period of a driving frame.

FIG. 5 is a signal timing diagram of scan signals and emission control signals during a horizontal period of a driving frame.

An operation of the display device according to an embodiment will be described with reference to FIGS. 2 and 5.

Referring to FIGS. 2 and 5, the horizontal period DF-H of the driving frame DF (refer to FIGS. 4A to 4C) refers to a time during which a data signal is provided to the pixels PX in one row shown in FIG. 1, that is, to the pixels PX arranged in the first direction DR1.

In an embodiment, a low-level scan signal GIj is provided through the scan line GILj during the initialization period, a low-level scan signal GCj is provided through the scan line GCLj, and a low level signal is provided through the emission control line EMLja. In this case, the fourth transistor T4 is turned on, and the first initialization voltage VINT1 is transmitted to the gate electrode of the first transistor T1 through the fourth transistor T4 which is turned on in response to the low level scan signal GIj. In this case, the fifth transistor T5 is turned on in response to the low-level scan signal GCj, and as the eighth transistor T8 is turned on in response to the low-level emission control signal EMja, the first driving voltage ELVDD is provided to the first node N1.

During the compensation period, the scan signal GIj is deactivated at a high level, and the scan signal GIj+1 is activated at a low level. As the third transistor T3 is turned on in response to the low-level scan signal GIj+1, the first transistor T1 is diode-connected and forward biased. Accordingly, a voltage (ELVDD-Vth) in which the first driving voltage ELVDD is reduced by the threshold voltage (Vth) of the first transistor T1 is applied to the gate electrode of the first transistor T1. As a result, the first driving voltage ELVDD is provided to one end of the capacitor Cst, and the voltage (ELVDD-Vth) is provided to the other end of the capacitor Cst.

When the emission control signal EMja is deactivated to a high level during the data writing period and the scan signal GWj is activated to a low level, the eighth transistor T8 is turned off and the second transistor T2 is turned on to transmit the data signal Di to the first node N1. Accordingly, a charge corresponding to the difference (Di-Vth) between the data signal Di and the threshold voltage Vth may be stored in the capacitor Cst.

Meanwhile, the seventh transistor T7 is turned on by receiving the low-level scan signal GWj+1 through the scan line GWLj+1. A portion of the current flowing through the light emitting diode ED by the seventh transistor T7 may escape through the seventh transistor T7 as a bypass current.

Next, when all of the emission control signals EMja and EMjb are activated to a low level during the emission period, a current path is formed through the first driving voltage line VL1 and the second driving voltage line VL2. A driving current is generated based on a voltage difference between the gate voltage of the gate electrode G1 of the first transistor T1 and the first driving voltage ELVDD, and a driving current is supplied to the light emitting diode ED through the sixth transistor T6 so that the current flows through the light emitting diode ED.

Figure 6:
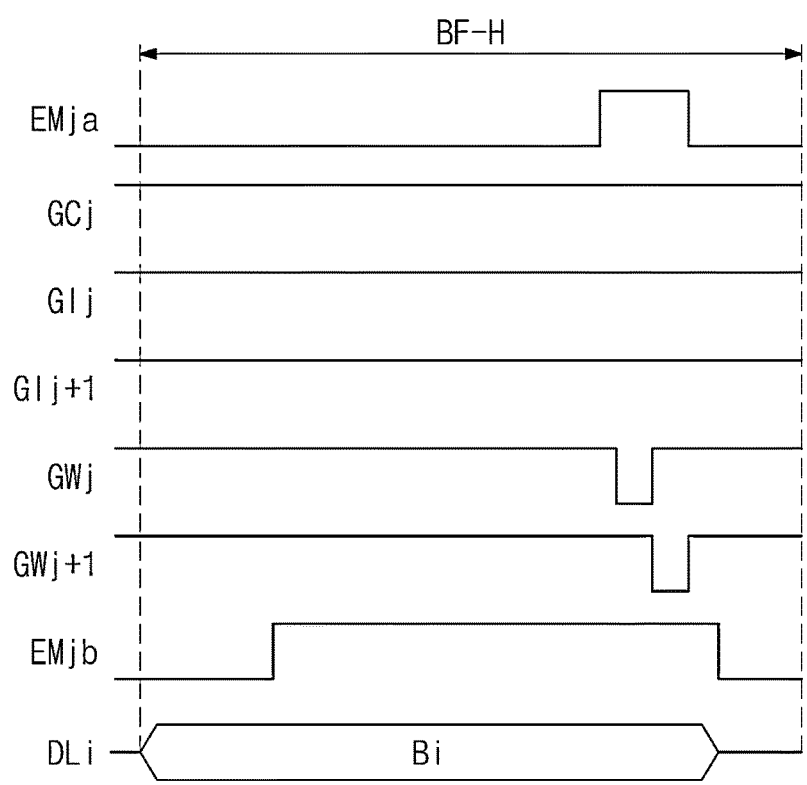
FIG. 6 is a signal timing diagram of scan signals and emission control signals during a horizontal period of a bias frame.

FIG. 6 is a signal timing diagram of scan signals and emission control signals during a horizontal period of a bias frame.

Referring to FIGS. 2 and 6, the horizontal period BF-H of the bias frame BF (refer to FIGS. 4B and 4C) refers to a time during which the bias signal is provided to the pixels PX in one row illustrated in FIG. 1, that is, the pixels PX arranged in the first direction DR1.

During the bias frame BF, the scan signals GCj, GIj, and GIj+1 are maintained at a high level, which is an inactive level. Accordingly, the third, fourth, and fifth transistors T3, T4, and T5 may be maintained in a turned-off state.

When the emission control signal EMja is deactivated to a high level during the bias writing period and the scan signal GWj is activated to a low level, the eighth transistor T8 is turned off and the second transistor T2 is turned on to transmit the bias signal Bi to the first electrode S1 of the first transistor T1.

The threshold voltage (Vth) of the first transistor T1 may also vary based on the gate-source voltage of the first transistor T1. In an embodiment, for example, the threshold voltage (Vth) of the first transistor T1 may have a first average level when the gate-source voltage is rising from a low level to a high level, and may have a second average level different from the first average level when the gate-source voltage is lowered from the high level to the low level. The first average level and the second average level may derive different current-voltage (I-V) characteristic curves of the first transistor T. Such a dependence of the threshold voltage (Vth) on the gate-source voltage may be referred to as the hysteresis of the transistor.

Due to the hysteresis characteristic of the first transistor T1, the driving current of the first transistor T1 is affected by the data voltage Di applied in the current frame by the data signal Di applied in the previous frame. Specifically, when the data signal Di for displaying a specific grayscale image in the current frame is provided after the data signal Di for displaying a low grayscale image in the previous frame is applied, an image of a grayscale higher than a specific grayscale of the current frame may be displayed on the light emitting diode ED. In addition, when a signal Di for displaying an image of a specific grayscale in the current frame is provided after the data voltage Vdata for displaying a high grayscale image in the previous frame is applied, an image of a grayscale lower than a specific grayscale of the current frame may be displayed on the light emitting diode ED.

When the driving frequency of the display device DD is high, the change period of the data signal Di is fast, such that the change in luminance due to the hysteresis characteristic described above may not occur. However, as the driving frequency of the display device DD decreases, since the change period of the data signal Di becomes longer, a change in luminance due to the hysteresis characteristic of the first transistor T may be recognized by a user. Especially, in a variable frequency mode in which the driving frequency is frequently changed from the first frequency to the second frequency and from the second frequency to the first frequency, a luminance change due to the hysteresis characteristic may be recognized by the user.

In an embodiment, as shown in FIG. 4B, during the bias frame BF between the driving frame DF in the frame F21 and the driving frame DF in the frame F22, the bias signal Bi is provided to the first electrode S1 of the first transistor T1, such that a change in luminance due to the hysteresis characteristic of the first transistor T1 may be minimized. The bias signal Bi may be determined by a voltage level capable of making the gate-source voltage difference of the first transistor T1 as large as possible. In an embodiment, by providing a same bias signal Bi to the first electrode of the first transistor T1 in all the pixels PX shown in FIG. 1 during the bias frame BF, the first transistor T1 may be initialized. Accordingly, a change in luminance due to the hysteresis characteristic of the first transistor T1 may be minimized.

In an embodiment, as shown in FIG. 4C, when the driving frequency of the display device DD is set to a third frequency (e.g., 60 Hz), the duration of one frame F31 is longer than when the driving frequency of the display device DD is the first frequency (e.g., 240 Hz). In this case, a change in luminance due to the hysteresis characteristic of the first transistor T1 may be recognized by the user. When the driving frequency is the third frequency, one frame F31 may include three bias frames BF. That is, by periodically providing the bias signal Bi to the first electrode of the first transistor T1 three times during one frame F31, a change in luminance due to the hysteresis characteristic of the first transistor T1 may be minimized.

In an embodiment illustrated in FIG. 1, the driving controller 100 may provide the image data signal DATA corresponding to the image signal RGB to the data driving circuit 200 during the driving frame DF. In such an embodiment, the driving controller 100 may provide the image data signal DATA corresponding to a predetermined grayscale level to the data driving circuit 200 during the bias frame BF. The predetermined grayscale level may be a grayscale level capable of compensating for the hysteresis characteristic of the first transistor T1.

In an embodiment, the data driving circuit 200 may provide the bias signals B1 to Bn to the data lines DL1 to DLn, respectively, during the bias frame BF based on the frequency information in the data control signal DCS. The bias signals B1 to Bn provided to the data lines DL1 to DLn may have a same voltage level as each other.

Figure 7:
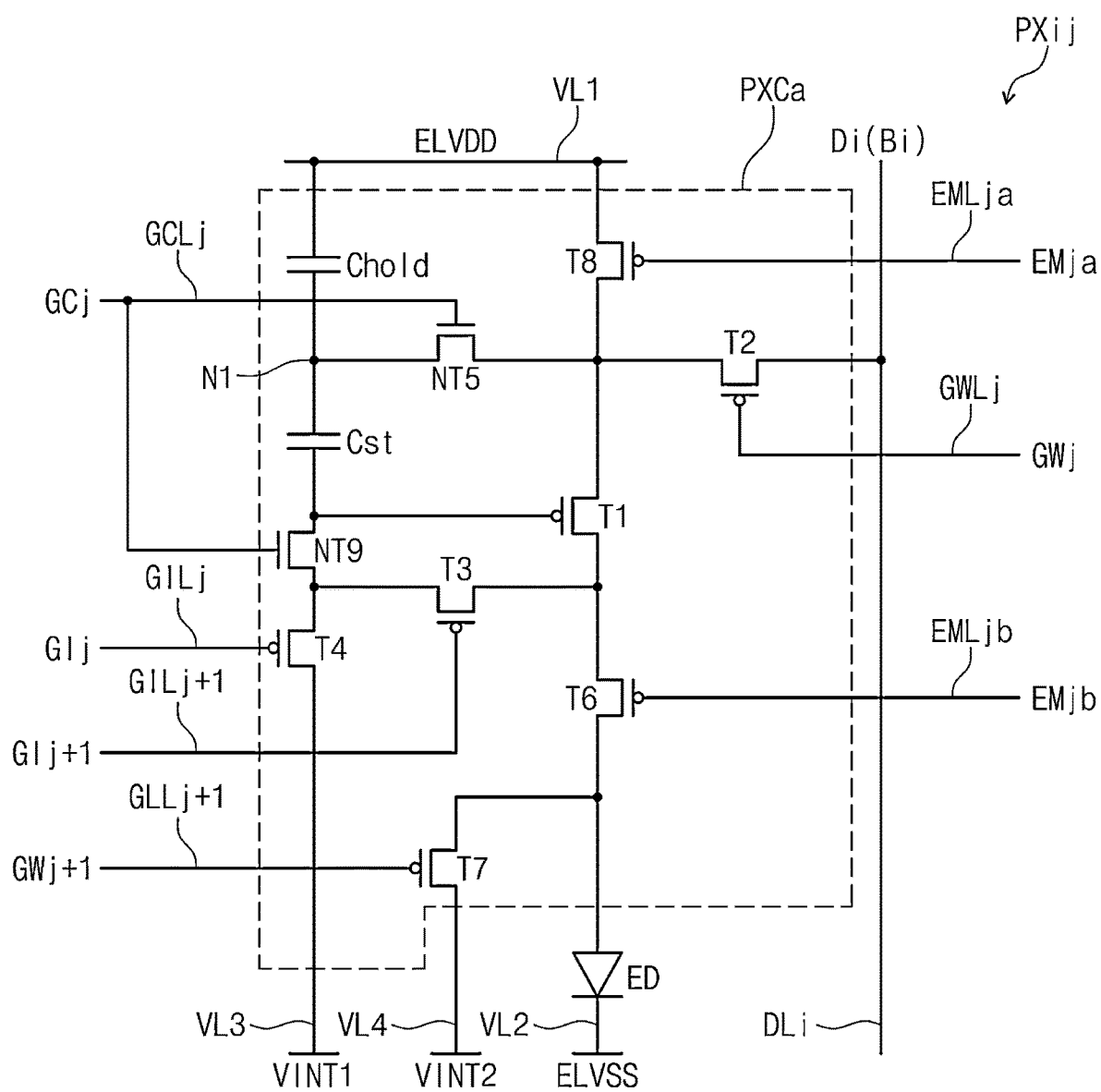
FIG. 7 is an equivalent circuit diagram of a pixel according to an embodiment of the invention.
Figure 8:
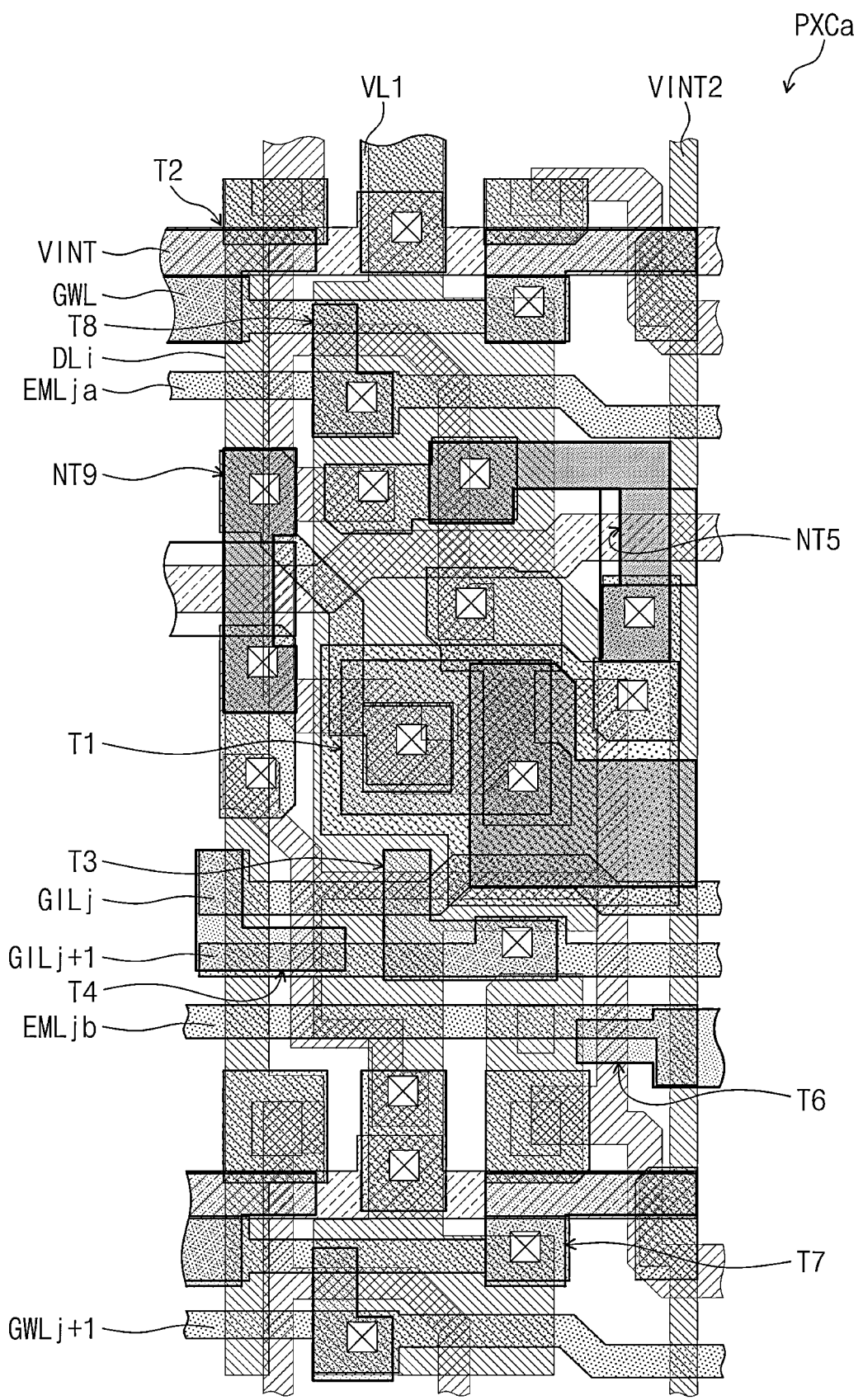
FIG. 8 is a plan view of an embodiment of the pixel circuit unit shown in FIG. 7.

FIG. 7 is an equivalent circuit diagram of a pixel according to an embodiment of the invention. FIG. 8 is a plan view of an embodiment of the pixel circuit unit shown in FIG. 7.

Referring to FIGS. 7 and 8, an embodiment of the pixel circuit unit PXCa includes first to ninth transistors T1, T2, T3, T4, NT5, T6, T7, T8, and NT9 and capacitors Cst and Chold. Each of the first to fourth transistors T1 to T4 and the sixth to eighth transistors T6 to T8 is a P-type transistor having an LTPS semiconductor layer. The fifth transistor NT5 and the ninth transistor NT9 are N-type transistors using an oxide semiconductor as a semiconductor layer.

Each of the first to fourth transistors T1 to T4, the sixth to eighth transistors T6 to T8, and the capacitors Cst and Chold shown in FIG. 7 has the same circuit configuration as the first to fourth transistors T1 to T4, the sixth to eighth transistors T6 to T8, and the capacitors Cst and Chold shown in FIG. 2, so that the same withdrawal symbol is used together, and any repetitive detailed description thereof will be omitted or simplified.

The fifth transistor NT5 includes a first electrode connected to the first electrode of the first transistor T1, a second electrode connected to the first node N1, and a gate electrode connected to the scan line GCLj. The fifth transistor NT5 is turned on in response to the scan signal GCj received through the scan line GCLj to electrically connect the first electrode of the first transistor T1 and the first node.

The ninth transistor NT9 includes a first electrode connected to the gate electrode of the first transistor T1, a second electrode connected to the second electrode of the third transistor T3, and a gate electrode connected to the scan line GCLj. The ninth transistor NT9 is turned on in response to the scan signal GCj received through the scan line GCLj to electrically connect the first electrode of the first transistor T1 and the first node.

Figure 9:
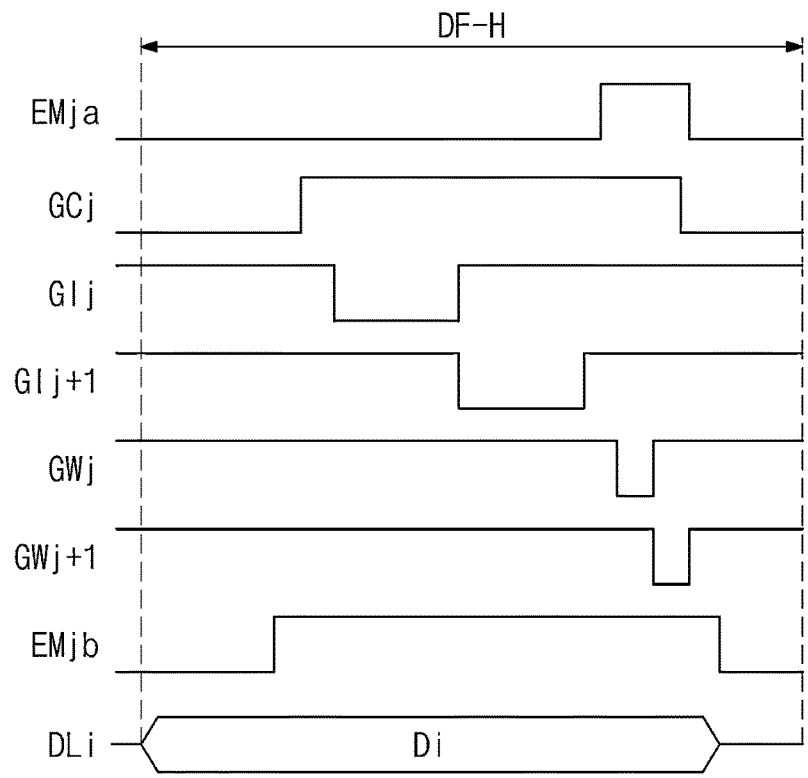
FIG. 9 is a signal timing diagram of scan signals and emission control signals shown in FIG. 7 during a horizontal period of a driving frame.

FIG. 9 is a signal timing diagram of scan signals and emission control signals shown in FIG. 7 during a horizontal period of a driving frame.

Referring to FIGS. 7 and 9, the horizontal period DF-H of the driving frame DF (refer to FIGS. 4A to 4C) refers to a time during which a data signal is provided to the pixels PX in one row shown in FIG. 1, that is, to the pixels PX arranged in the first direction DR1.

In an embodiment, a low-level scan signal GIj is provided through the scan line GILj during the initialization period, a high-level scan signal GCj is provided through the scan line GCLj, and a low level signal is provided through the emission control line EMLja. In this case, the fourth transistor-T4 is turned on, and the first initialization voltage VINT1 is transmitted to the gate electrode of the first transistor T1 through the fourth transistor T4 which is turned on in response to the low level scan signal GIj. In this case, the fifth transistor NT5 is turned on in response to the high-level scan signal GCj, and as the eighth transistor T8 is turned on in response to the low-level emission control signal EMja, the first driving voltage ELVDD is provided to the first node N1. In this case, the ninth transistor NT9 is maintained in a turned-on state in response to the high-level scan signal GCj.

During the compensation period, the scan signal GIj is deactivated at a high level, and the scan signal GIj+1 is activated at a low level. As the third transistor T3 is turned on in response to the low-level scan signal GIj+1, the first transistor T1 is diode-connected through the third transistor T3 and the ninth transistor NT9 and is forward biased. Accordingly, a voltage (ELVDD-Vth) in which the first driving voltage ELVDD is reduced by the threshold voltage (Vth) of the first transistor T1 is applied to the gate electrode of the first transistor T1. As a result, the first driving voltage ELVDD is provided to one end of the capacitor Cst, and the voltage (ELVDD-Vth) is provided to the other end of the capacitor Cst.

When the emission control signal EMja is deactivated to a high level during the data writing period and the scan signal GWj is activated to a low level, the eighth transistor T8 is turned off and the second transistor T2 is turned on to transmit the data signal Di to the first node N1. Accordingly, a charge corresponding to the difference (Di-Vth) between the data signal Di and the threshold voltage Vth may be stored in the capacitor Cst.

In such an embodiment, the seventh transistor T7 is turned on by receiving the low-level scan signal GWj+1 through the scan line GWLj+1. A portion of the current flowing through the light emitting diode ED by the seventh transistor T7 may flow through the seventh transistor T7 as a bypass current.

Next, when all of the emission control signals EMja and EMjb are activated to a low level during the emission period, a current path is formed through the first driving voltage line VL1 and the second driving voltage line VL2. A driving current is generated based on a voltage difference between the gate voltage of the gate electrode G1 of the first transistor T1 and the first driving voltage ELVDD, and a driving current is supplied to the light emitting diode ED through the sixth transistor T6 so that the current flows through the light emitting diode ED.

Figure 10:
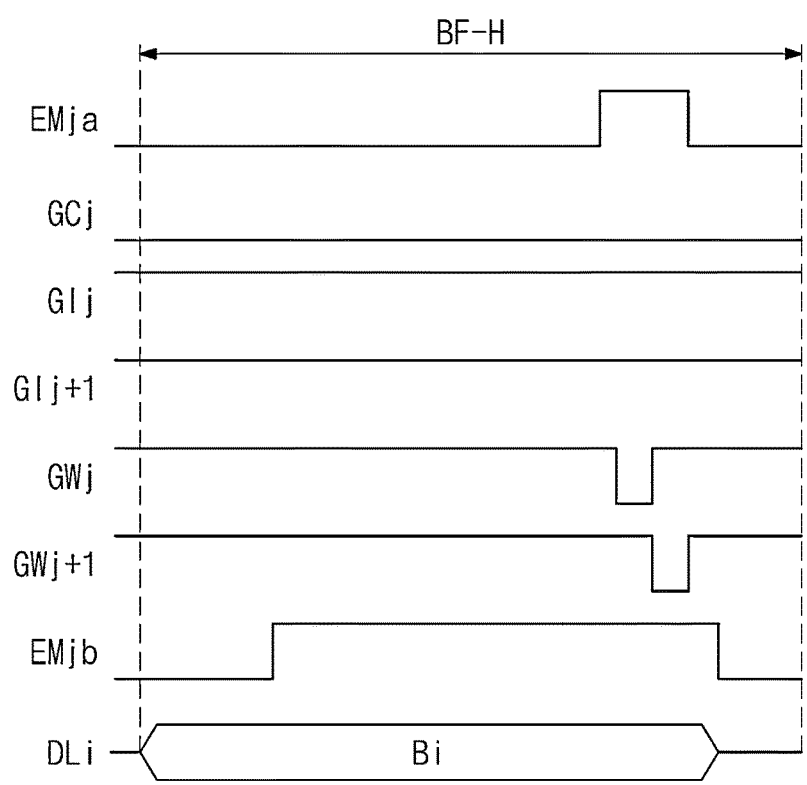
FIG. 10 is a signal timing diagram of scan signals and emission control signals shown in FIG. 7 during a horizontal period of a bias frame.

FIG. 10 is a signal timing diagram of scan signals and emission control signals shown in FIG. 7 during a horizontal period of a bias frame.

Referring to FIGS. 7 and 10, the horizontal period DF-B of the bias frame BF (refer to FIGS. 4B and 4C) refers to a time during which the bias signal is provided to the pixels PX in one row illustrated in FIG. 1, that is, the pixels PX arranged in the first direction DR1.

During the bias frame BF, the scan signal GCj is maintained at a low level that is an inactive level, and the scan signals GIj and GIj+1 are maintained at a high level that is an inactive level. Accordingly, the third, fourth, and fifth transistors T3, T4, and T5 may be maintained in a turned-off state.

When the emission control signal EMja is deactivated to a high level during the bias writing period and the scan signal GWj is activated to a low level, the eighth transistor T8 is turned off and the second transistor T2 is turned on to transmit the bias signal Bi to the first electrode S1 of the first transistor T1.

In embodiments of the invention, as described herein, a display device may change the driving frequency as desired. In such embodiments, when the driving frequency is lowered, a bias signal of a predetermined level is provided to each of the pixels to prevent display quality deterioration due to the hysteresis characteristic of the transistor.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A pixel comprising:
   a first transistor including a first electrode, a second electrode, and a gate electrode electrically connected to a first voltage line which receives a first voltage;
   a first capacitor connected between a first node and the gate electrode of the first transistor;
   a light emitting diode including a first electrode electrically connected to the second electrode of the first transistor and a second electrode connected to a second voltage line which receives a second voltage;
   a second transistor including a first electrode connected to a data line, a second electrode electrically connected to the first electrode of the first transistor, and a gate electrode which receives a first scan signal;
   a third transistor including a first electrode electrically connected to the second electrode of the first transistor, a second electrode electrically connected to the gate electrode of the first transistor, and a gate electrode which receives a second scan signal; and
   a fourth transistor including a first electrode electrically connected to the first electrode of the first transistor, a second electrode electrically connected to the first node, and a gate electrode which receives a third scan signal,
   wherein the first capacitor is connected between the second electrode of the fourth transistor and the gate electrode of the first transistor, and
   wherein the first electrode of the first transistor receives a data signal during a driving frame and receives a bias signal during a bias frame through the data line and the second transistor.

2. The pixel of claim 1, wherein each of the first to third scan signals is activated in a predetermined order during the driving frame.

3. The pixel of claim 1, wherein during the bias frame, the first scan signal is activated, and the second to third scan signals are maintained at inactive levels.

4. The pixel of claim 1, further comprising:
   a second capacitor electrically connected between the first voltage line and the first node;
   a fifth transistor including a first electrode electrically connected to the gate electrode of the first transistor, a second electrode electrically connected to a third voltage line which receives a third voltage, and a gate electrode which receives a fourth scan signal;
   a sixth transistor including a first electrode connected to the second electrode of the first transistor, a second electrode connected to the first electrode of the light emitting diode, and a gate electrode which receives a first emission control signal;
   a seventh transistor including a first electrode connected to the second electrode of the sixth transistor, a second electrode electrically connected to a fourth voltage line which receives a fourth voltage, and a gate electrode which receives a fifth scan signal; and
   an eighth transistor including a first electrode connected to the first voltage line, a second electrode connected to the first electrode of the first transistor, and a gate electrode which receives a second emission control signal.

5. The pixel of claim 4,
   wherein each of the first to fifth scan signals is activated in a predetermined order during the driving frame,
   wherein during the bias frame, the second to fourth scan signals are maintained at inactive levels, and the first scan signal and the fifth scan signal are activated in a predetermined order.

6. The pixel of claim 4, wherein in each of the driving frame and the bias frame, the first emission control signal and the second emission control signal are activated in a predetermined order.

7. The pixel of claim 4, wherein each of the first to eighth transistors is a P-type transistor.

8. The pixel of claim 4, further comprising:
   a ninth transistor including a first electrode connected to the gate electrode of the first transistor, a second electrode connected to the second electrode of the third transistor, and a gate electrode which receives the fourth scan signal.

9. The pixel of claim 8, wherein
   each of the first to fourth transistors and the sixth to eighth transistors is a P-type transistor, and
   each of the fifth transistor and the ninth transistor is an N-type transistor.

10. A display device comprising:
    a pixel connected to a plurality of scan lines and a data line;
    a scan driving circuit which outputs a plurality of scan signals for driving the pixel to the plurality of scan lines;
    a data driving circuit which outputs a data signal to the data line during a driving frame and output a bias signal to the data line during a bias frame; and
    a driving controller which controls the scan driving circuit and the data driving circuit,
    wherein the pixel emits light in response to the data signal received through the data line during the driving frame, and is initialized in response to the bias signal received through the data line during the bias frame,
    wherein the plurality of signals comprises first to third scan signals, wherein the pixel comprises:
a first transistor including a first electrode, a second electrode, and a gate electrode electrically connected to a first voltage line which receives a first voltage;
a first capacitor connected between a first node and the gate electrode of the first transistor;
a light emitting diode including a first electrode electrically connected to the second electrode of the first transistor and a second electrode connected to a second voltage line which receives a second voltage;
a second transistor including a first electrode connected to a data line, a second electrode electrically connected to the first electrode of the first transistor, and a gate electrode which receives the first scan signal;
a third transistor including a first electrode electrically connected to the second electrode of the first transistor, a second electrode electrically connected to the gate electrode of the first transistor, and a gate electrode which receives the second scan signal; and
a fourth transistor including a first electrode electrically connected to the first electrode of the first transistor, a second electrode electrically connected to the first node, and a gate electrode which receives the third scan signal,
wherein the first capacitor is connected between the second electrode of the fourth transistor and the gate electrode of the first transistor, and
wherein the first electrode of the first transistor receives the data signal during the driving frame and receives the bias signal during the bias frame through the data line and the second transistor.

11. The display device of claim 10, wherein the driving controller determines a driving frequency and controls the data driving circuit and the scan driving circuit to operate as the driving frame and the bias frame based on the driving frequency.

12. The display device of claim 11, wherein the scan driving circuit activates each of the plurality of scan signals in a predetermined order during the driving frame.

13. The display device of claim 11,
wherein the driving controller determines the driving frequency as one selected from a first frequency and a second frequency lower than the first frequency,
wherein when the driving controller determines the driving frequency as the first frequency, one frame comprises only the driving frame,
wherein when the driving controller determines the driving frequency as the second frequency, one frame comprises the driving frame and the bias frame.

14. The display device of claim 10, wherein the scan driving circuit maintains the second to third scan signals at an inactive level during the bias frame and activates the first scan signal.

15. The display device of claim 10, further comprising:
an emission driving circuit which outputs a first emission control signal and a second emission control signal,
wherein the plurality of scan signals further comprises a fourth scan signal and a fifth scan signal, wherein the pixel further comprises:
a second capacitor electrically connected between the first voltage line and the first node;
a fifth transistor including a first electrode electrically connected to the gate electrode of the first transistor, a second electrode electrically connected to a third voltage line which receives a third voltage, and a gate electrode which receives the fourth scan signal;
a sixth transistor including a first electrode connected to the second electrode of the first transistor, a second electrode connected to the first electrode of the light emitting diode, and a gate electrode which receives the first emission control signal;
a seventh transistor including a first electrode connected to the second electrode of the sixth transistor, a second electrode electrically connected to a fourth voltage line which receives a fourth voltage, and a gate electrode which receives the fifth scan signal; and
an eighth transistor including a first electrode connected to the first voltage line, a second electrode connected to the first electrode of the first transistor, and a gate electrode which receives a second emission control signal.

16. The display device of claim 15,
wherein the scan driving circuit activates each of the first to fifth scan signals in a predetermined order during the driving frame,
wherein the scan driving circuit maintains the second to fourth scan signals at inactive levels during the bias frame and activates the first scan signal and the fifth scan signal in a predetermined order, respectively.

17. The display device of claim 15, wherein each of the first to eighth transistors is a P-type transistor.

18. The display device of claim 15, further comprising:
a ninth transistor including a first electrode connected to the gate electrode of the first transistor, a second electrode connected to the second electrode of the third transistor, and a gate electrode which receives the fourth scan signal.

19. The display device of claim 18, wherein
each of the first to fourth transistors and the sixth to eighth transistors is a P-type transistor, and each of the fifth transistor and the ninth transistor is an N-type transistor.

* * * * *